United States Patent [19]

Long, Jr.

[11] Patent Number: 4,465,176
[45] Date of Patent: Aug. 14, 1984

[54] APPARATUS FOR ORIENTING ARTICLES

[75] Inventor: Clarence S. Long, Jr., Greensboro, N.C.

[73] Assignee: AMP Incorporated, Harrisburg, Pa.

[21] Appl. No.: 407,369

[22] Filed: Aug. 12, 1982

[51] Int. Cl.³ .................................... B65G 47/24
[52] U.S. Cl. .............................. 198/400; 193/44
[58] Field of Search ............... 198/388, 398–400; 221/157, 171; 193/44–47

[56] References Cited

U.S. PATENT DOCUMENTS

| | | | |
|---|---|---|---|
| 3,134,477 | 5/1964 | Moore | 198/388 |
| 3,339,702 | 9/1967 | Novak et al. | 198/400 |
| 3,537,567 | 11/1970 | Nowicki | 198/388 X |
| 3,782,526 | 1/1974 | Simons | 198/399 X |
| 3,811,551 | 5/1974 | Eddy | 198/388 |
| 4,056,187 | 11/1977 | Ajero | 193/45 X |

Primary Examiner—Joseph E. Valenza
Assistant Examiner—David A. Bucci
Attorney, Agent, or Firm—R. W. J. Usher

[57] ABSTRACT

Apparatus for orienting articles having a coding feature comprising an inclined article-receiving track into which extends a trip aligned with the path of the coding feature in one orientation of a leading end of the article and arranged to cause pivotal movement of the article in one direction thereby to invert the article to change the orientation of the leading end article. The track may have first and second parts one above the other and inclined in mutually opposite directions with an exit end of the first track part being spaced from the entry end of the second track part by a gateway, the trip comprising a rotating wheel in the gateway.

5 Claims, 8 Drawing Figures

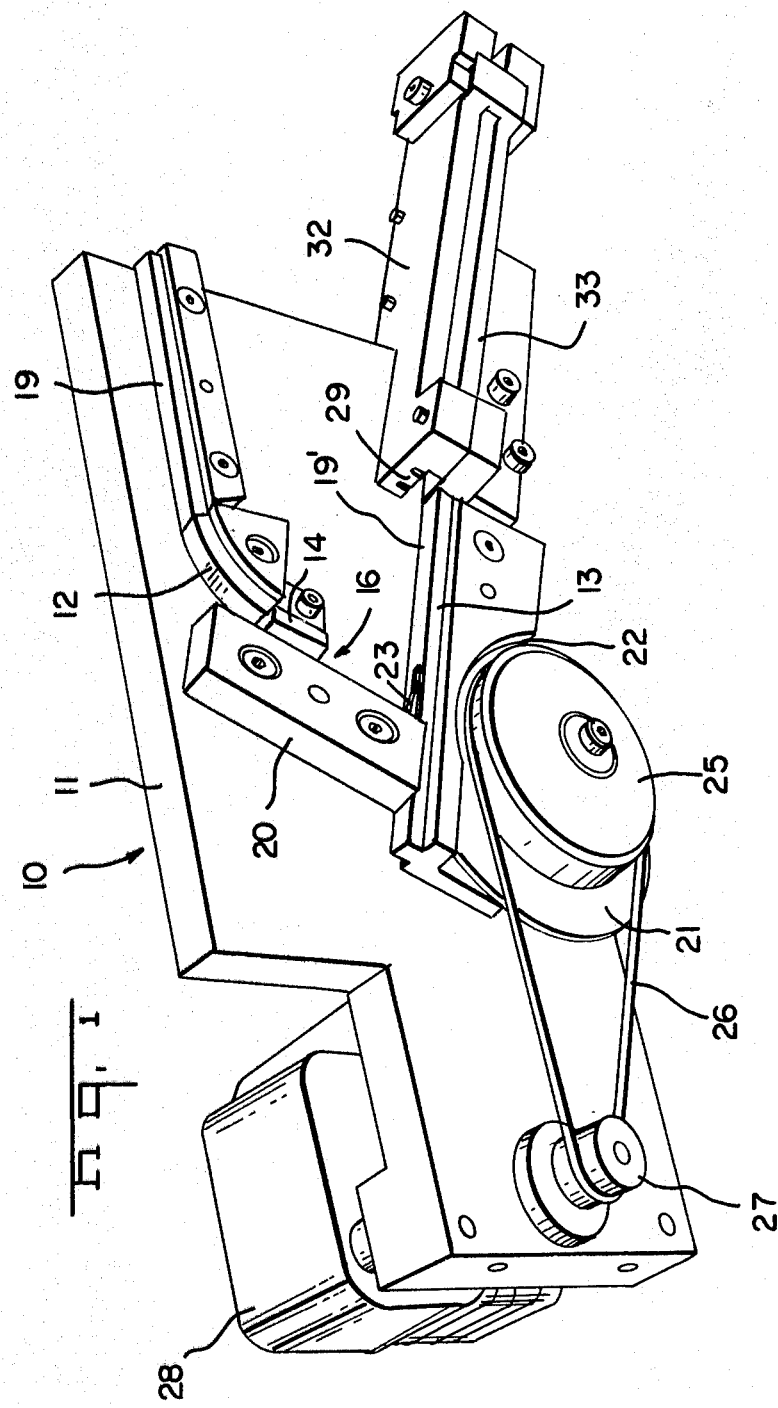

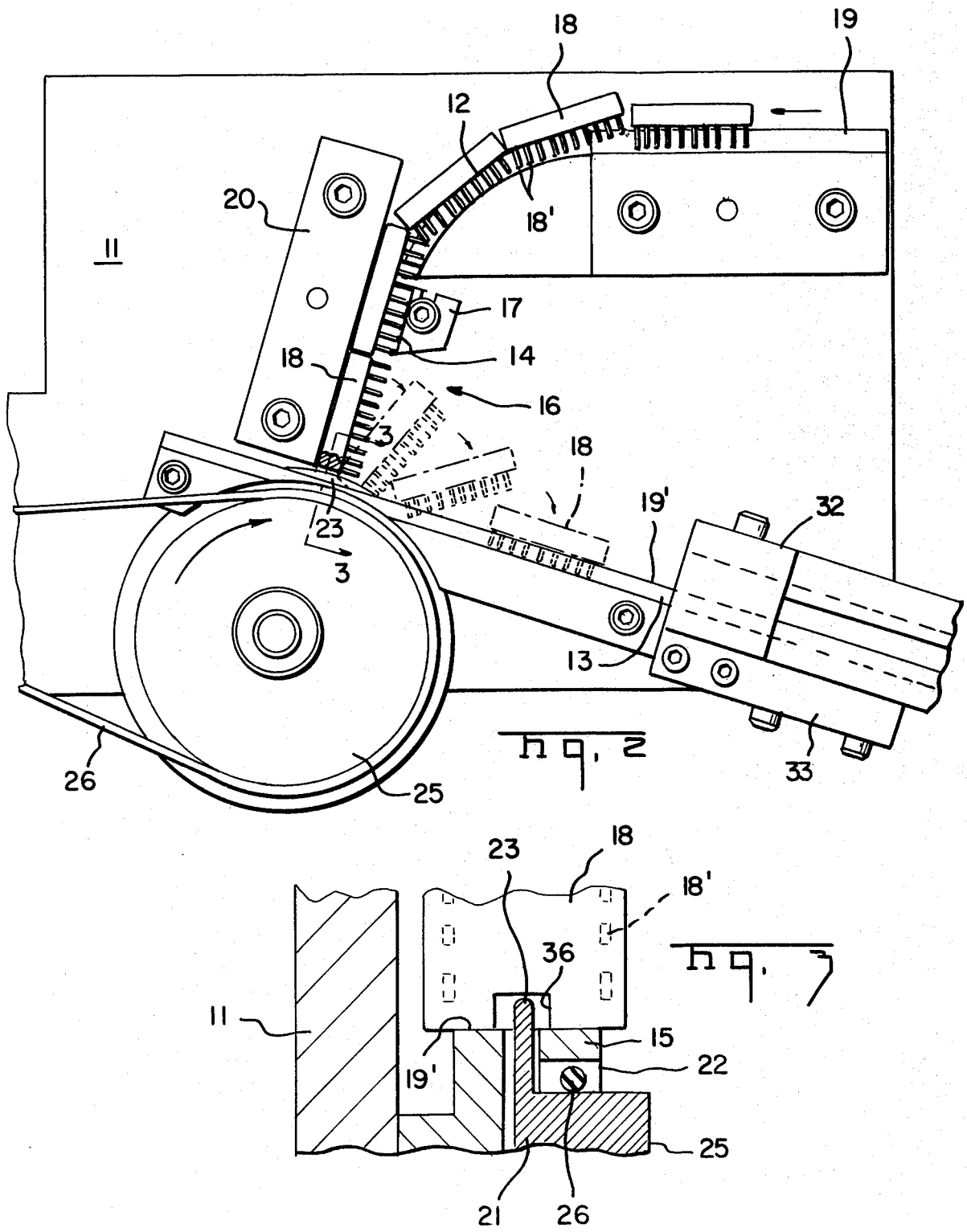

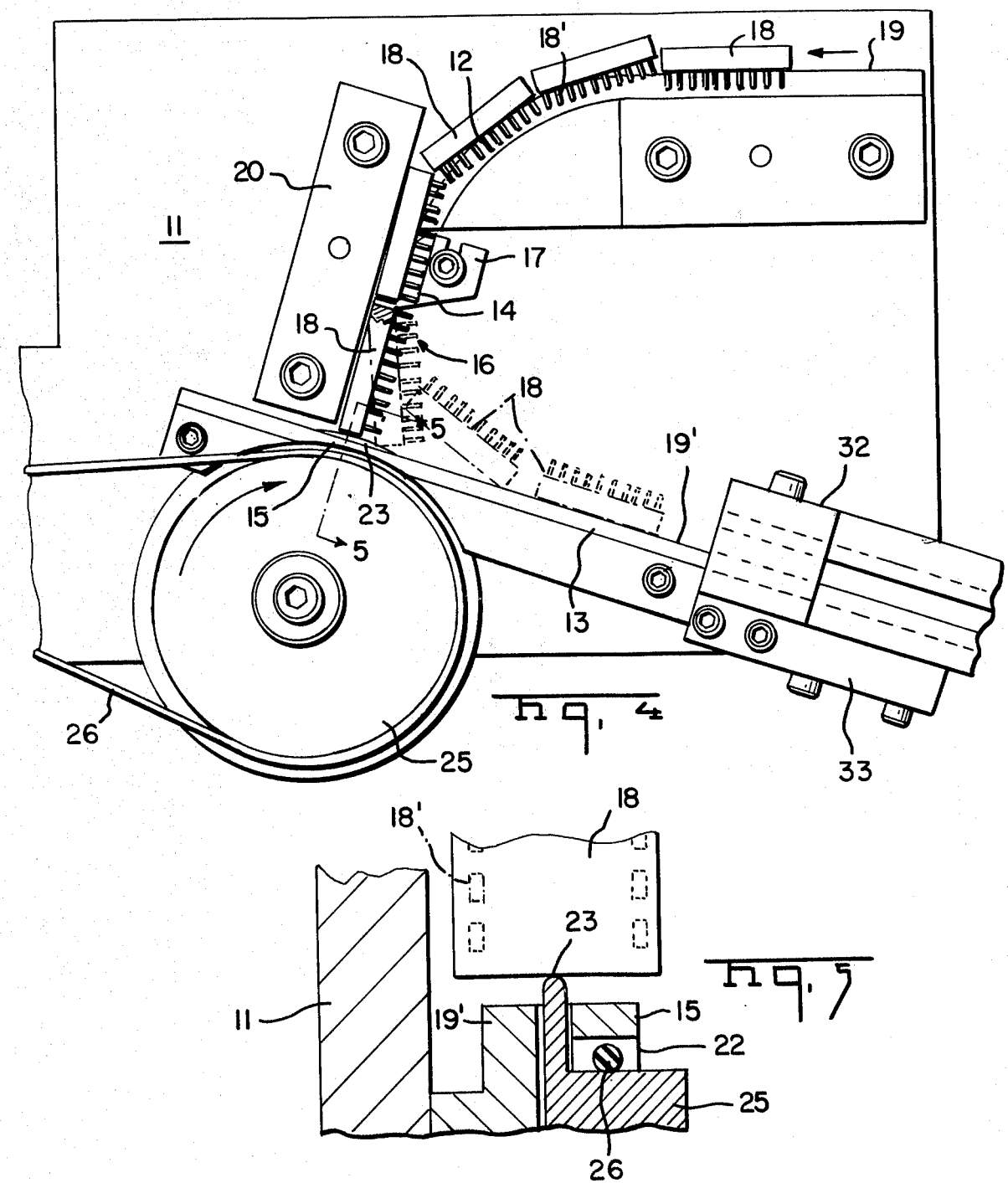

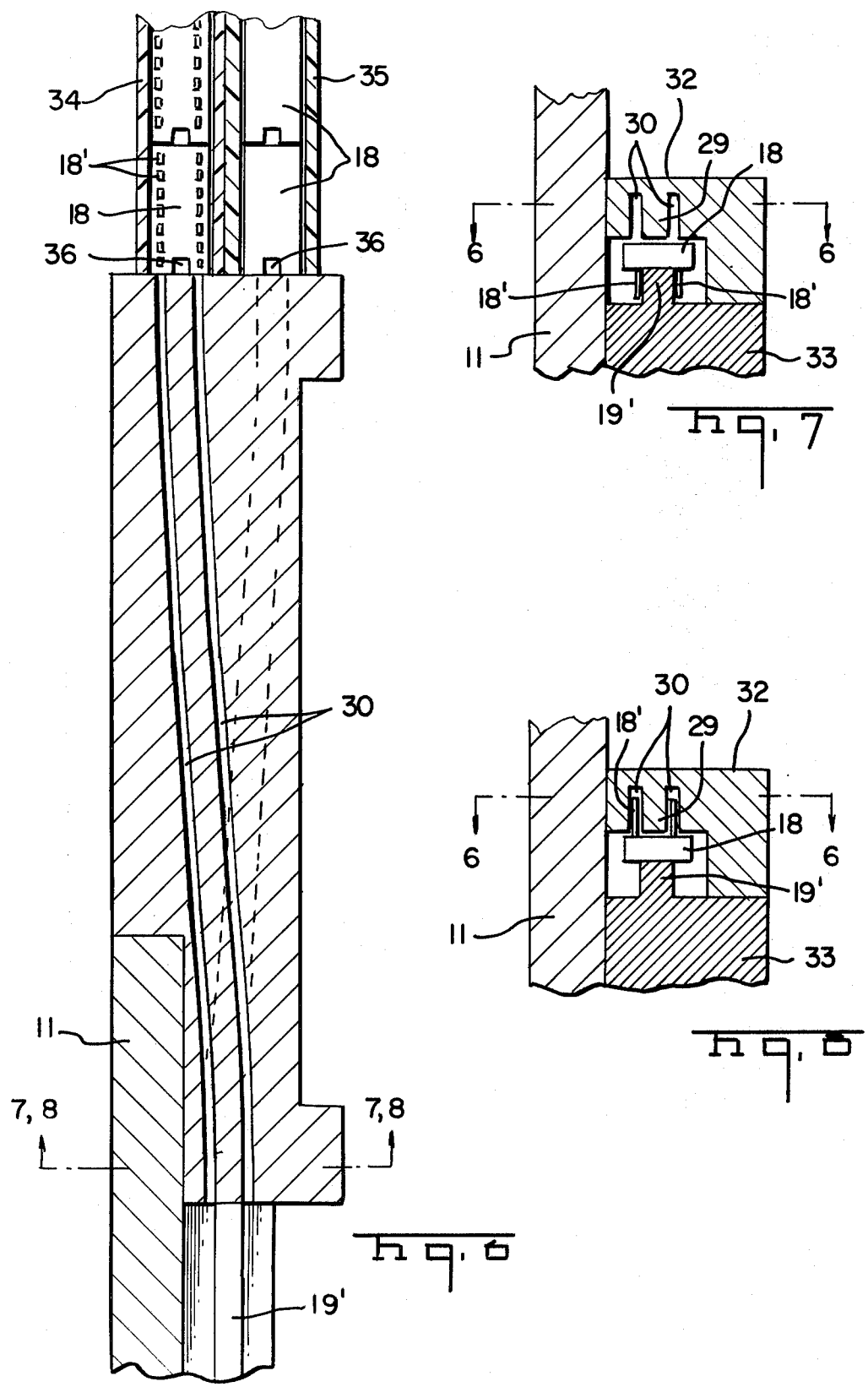

APPARATUS FOR ORIENTING ARTICLES

This invention relates to apparatus for orienting articles.

It is often required to orient articles such as workpieces in a predetermined direction for alignment with tooling on a production line or for storage.

One type of prior orienting apparatus is the vibratory hopper type having spiral tracks extending to article outlets. Vibrations having a suitable characteristic urge the articles along the tracks compelling correct orientation for delivery to the outlet. Barriers or gates may be located on the tracks to permit only suitably orientated articles to complete their travel along the track.

The vibratory hoppers are relatively expensive, however, and require precise tuning and careful installation and maintenance to obtain reliable effective performance. They may also be relatively bulky and noisy.

Another type of orienting apparatus comprises conveyor belts across which extend stationary barriers which engage and assist in orienting articles carried by the conveyor belts and define between their gateways admitting only articles having the required orientation.

However, the latter type of orienting apparatus is very bulky and may be complex and expensive.

There is a requirement for a relatively compact and inexpensive apparatus for effecting limited orientation of workpiece such as electrical components.

According to the invention, apparatus for orienting articles having a coding feature at one end comprises first and second tracks arranged to feed articles in end-to-end relation, the tracks being inclined one above the other in mutually opposite directions with an exit end of the first track adjacent and spaced from an entry end of the second track to define between them a gateway, a wheel mounted at the entry end of the second track to protrude into the gateway, and means being provided to rotate the wheel in a first rotational direction towards the exit end of the second track, the arrangement being such that, in operation of the apparatus with the first end of an article leading, the wheel will engage the leading end during transition of the article from the exit end of the first track to the entry end of the second track with the trailing end of the article still engaging the exit end of the first track thereby pivoting the article in a second, opposite, rotational direction through the gateway first end leading on to the second track, and with a second, opposite, end of the article leading, the wheel will not engage the article permitting the article to pivot freely through the gate in the first rotational direction, first end leading on to the second track.

The apparatus according to the invention ensures that the articles are always delivered to the exit end of the second track in the same predetermined orientation; i.e., with the first end leading.

A particular application of the apparatus is in the feeding of dual-in-line plug headers (or dual-in-line sockets). Such headers or sockets comprise an elongate body of insulating material in which are mounted two spaced parallel rows of posts. One end of the body is formed with a coding feature such as a recess sized to freely receive the wheel when that one end is leading.

The tracks may each comprise a rail adapted to support the body in sliding engagement with the posts located to opposite sides of the rail.

As the articles are turned upside down when engaged by the wheel, a third track comprising a post engaging guide may be arranged above the exit end of the second track to divert inverted articles to a different feed or storage area.

The apparatus may be of extremely simple and inexpensive construction and readily applied to existing production lines.

According to another aspect of the invention, the apparatus comprises a track inclined between an entry and exit end, and a trip extending through the track to protrude into the path of an article, the arrangement being such that, in operation of the apparatus, suitably coded articles fed end-to-end down the track will be engaged by the trip when one of the ends of the respective articles is leading to cause pivotal movement of the article in one direction thereby to invert that article and change the orientation of the leading end and an article will not be engaged by the trip when the other end is leading.

Preferably, the trip comprises a wheel rotated in a direction opposite to the pivotal direction.

A specific example of the invention will now be described with reference to the accompanying drawings in which:

FIG. 1 is a perspective view of the orienting apparatus according to the invention;

FIG. 2 is a plan view of part of the apparatus showing the passage of dual-in-line sockets with one end leading;

FIG. 3 is a fragmentary cross-section view taken along lines 3—3 of FIG. 2;

FIG. 4 is a view similar to FIG. 2 with the other end of the dual-in-line sockets leading;

FIG. 5 is a fragmentary cross-sectional view taken along lines 5—5 of FIG. 4;

FIG. 6 is a cross-sectional view of a third track portion of the apparatus;

FIGS. 7 and 8 are cross-sectional views through the third track portion and the exit end of the second track with the dual-in-line sockets upright and inverted, respectively.

The orienting apparatus 10 comprises a single frame plate 11 on one face of which are located first and second tracks 12 and 13, respectively defined by suitably shaped blocks. The tracks are arranged to extend inclined to the horizontal in mutually opposite directions with the first track located above the second track when the frame plate is located in a vertical plane so that an exit end portion 14 of the first track is spaced vertically apart from an entry end portion 15 of the second track to define a gateway 16 sufficiently wide to permit a dual-in-line socket 18 in transition from the first track to the second track to pass freely through the gateway as shown in FIG. 2.

The exit end portion 14 of the first track is formed with a slotted screw receiving mounting part 17 enabling its separation from the second track to be altered to accommodate dual-in-line sockets 18 of different lengths. Each track 12 and 13 is of inverted T-section, the upright defining rails 19, 19' for supporting a body part of the dual-in-line socket with the rows of posts 18' extending to each side of the rail. A guide block 20 is secured adjacent the gateway 16 to extend between the first and second tracks precisely to guide dual-in-line sockets to the gateway.

A disc 21 is rotatably mounted in a slotted rebate 22 in the second track block so that its periphery 23 protrudes through the entry end portion 15 into the gateway.

The disc is mounted on a first pulley 25 driven by a belt 26 extending around a second pulley 27 mounted on a drive shaft extending through the mounting plate to a conventional electric motor 28. The disc is rotated by the motor so that its periphery rotates towards the exit end of the second track; i.e., in a clockwise direction.

A third track 29 formed by a pair of post receiving parallel slots 30 cut into a track block 32 is secured over a continuation 33 of the second track to divert inverted dual-in-line sockets to a storage tube 34 located side-by-side with a storage tube 35 aligned with the exit end of the second track.

In operation of the apparatus, the motor is started and dual-in-line sockets 18 having coding recesses 36 in a second end are fed in end-to-end relation by conventional means to the first track 12 along which they slide under gravity into a transition area between the first and second tracks. If the second end of a dual-in-line socket is leading, the recess 36 will receive the periphery of the disc so that the disc periphery does not engage the end and the dual-in-line socket will pivot in a clockwise direction as shown in FIG. 2, to fall through the gateway on to the second track with the first end leading. If, however, the first end is leading in the transition area, the disc periphery will engage the leading end and pivot the dual-in-line socket counterclockwise as shown in FIG. 4 so that the dual-in-line socket falls through the gateway with the second track in an inverted condition with the first end leading. Thus, irrespective of the orientation of the articles lid on the first track, the first end will always lead after transition to the second track.

At the exit end of the second track the posts of the inverted dual-in-line sockets enter the slots 30 of the third track and are guided to the storage tube while the upright sockets remain on the second track and enter the other storage tube.

It will be appreciated that the apparatus may constitute a compact, simple and inexpensive attachment unit that may readily be added to existing production lines. No extensive tuning or difficult maintenance is required whilst a significant time saving may result from the orientation process.

I claim:

1. Apparatus for orienting articles having a coding feature at one end comprising first and second tracks arranged to feed articles in end-to-end relation the tracks being inclined one above the other in mutually opposite directions with an exit end of the first track adjacent and spaced from an entry end of the second track to define between them a gateway, a wheel mounted at the entry end of the second track to protrude into the gateway, and means being provided to rotate the wheel in a first rotational direction towards the exit end of the second track, the arrangement being such that, in operation of the apparatus with the first end of an article leading, the wheel will engage the leading end during transition of the article from the exit end of the first track to the entry end of the second track with the trailing end of the article still engaging the exit end of the first track thereby pivoting the article in a second, opposite, rotational direction through the gateway first end leading on to the second track and with a second, opposite, end of the article leading, the wheel will not engage the article permitting the article to pivot freely through the gate in the first rotational direction, first end leading on to the second track.

2. Apparatus according to claim 1 in which each track comprises a rail adapted to be received between the posts of a dual-in-line socket.

3. Apparatus according to claim 2 in which a third track comprising a post engaging guide is arranged above the exit end of the second track to divert inverted dual-in-line sockets to a different feed or storage area from upright dual-in-line sockets.

4. Apparatus according to claim 1 in which the exit end of the first track is defined by a member adjustably spaced from the entry end of the second track to accommodate articles of different lengths.

5. Apparatus according to any one of the preceding claims in which the first and second tracks, the wheel and the rotation means are all mounted on a single mounting plate.

* * * * *